United States Patent [19]

Pasiecznik, Jr.

[11] Patent Number: 5,148,103
[45] Date of Patent: Sep. 15, 1992

[54] APPARATUS FOR TESTING INTEGRATED CIRCUITS

[75] Inventor: John Pasiecznik, Jr., Malibu, Calif.

[73] Assignee: Hughes Aircraft Company, Los Angeles, Calif.

[21] Appl. No.: 606,676

[22] Filed: Oct. 31, 1990

[51] Int. Cl.$^5$ .............................................. G01R 31/00
[52] U.S. Cl. .............................. 324/158 P; 324/158 F; 439/482
[58] Field of Search ............ 324/72 S, 158 F, 158 P; 439/482, 86, 66, 67; 361/397, 401

[56] References Cited

U.S. PATENT DOCUMENTS

| | | | |
|---|---|---|---|
| 4,161,692 | 7/1979 | Tarzwell | 324/158 F |
| 4,697,143 | 9/1987 | Lockwood et al. | 324/158 P |
| 4,733,172 | 3/1988 | Smolley | 324/158 F |
| 4,783,625 | 11/1988 | Harry et al. | 324/158 F |
| 4,791,363 | 12/1988 | Logan | 324/158 P |
| 4,820,976 | 4/1989 | Brown | 324/158 F |
| 4,849,689 | 7/1989 | Gleason et al. | 324/158 F |
| 4,922,192 | 5/1990 | Gross et al. | 324/158 F |
| 4,928,061 | 5/1990 | Dampier et al. | 324/158 F |
| 5,027,063 | 6/1991 | Letourneau | 324/158 F |

*Primary Examiner*—Vinh Nguyen
*Attorney, Agent, or Firm*—V. D. Duraiswamy; W. K. Denson-Low

[57] ABSTRACT

A membrane probe (10, 12, 14, 16, 58, 144) for testing integrated circuits (56,138) while still on the wafer upon which they are manufactured includes a flexible visually clear and self planarizing membrane (26) having circuit traces (20) and ground shielding planes (14), terminating resistor (152) and active buffer chips (172) formed thereon. Probe contact pads (36,38) electroplated on areas of the traces, and connector pads (32) plated on the membrane facilitate rapid detachable connection to a test fixture (50). The probe has a configuration, dimension and structure like that of the wafer itself so that automated pick and place equipment (136, 142) employed for handling the wafers (138) may also be used to handle the probes (144). An unique test fixture (50) is adapted to receive and detachably secure a selected probe to the fixture. A metal-on-elastomer annulus (88,104) is employed in the test fixture to make electrical contact between contact pads (32) plated on the back side of the membrane probe and a printed circuit board that is used to route signals to the testing equipment.

15 Claims, 4 Drawing Sheets

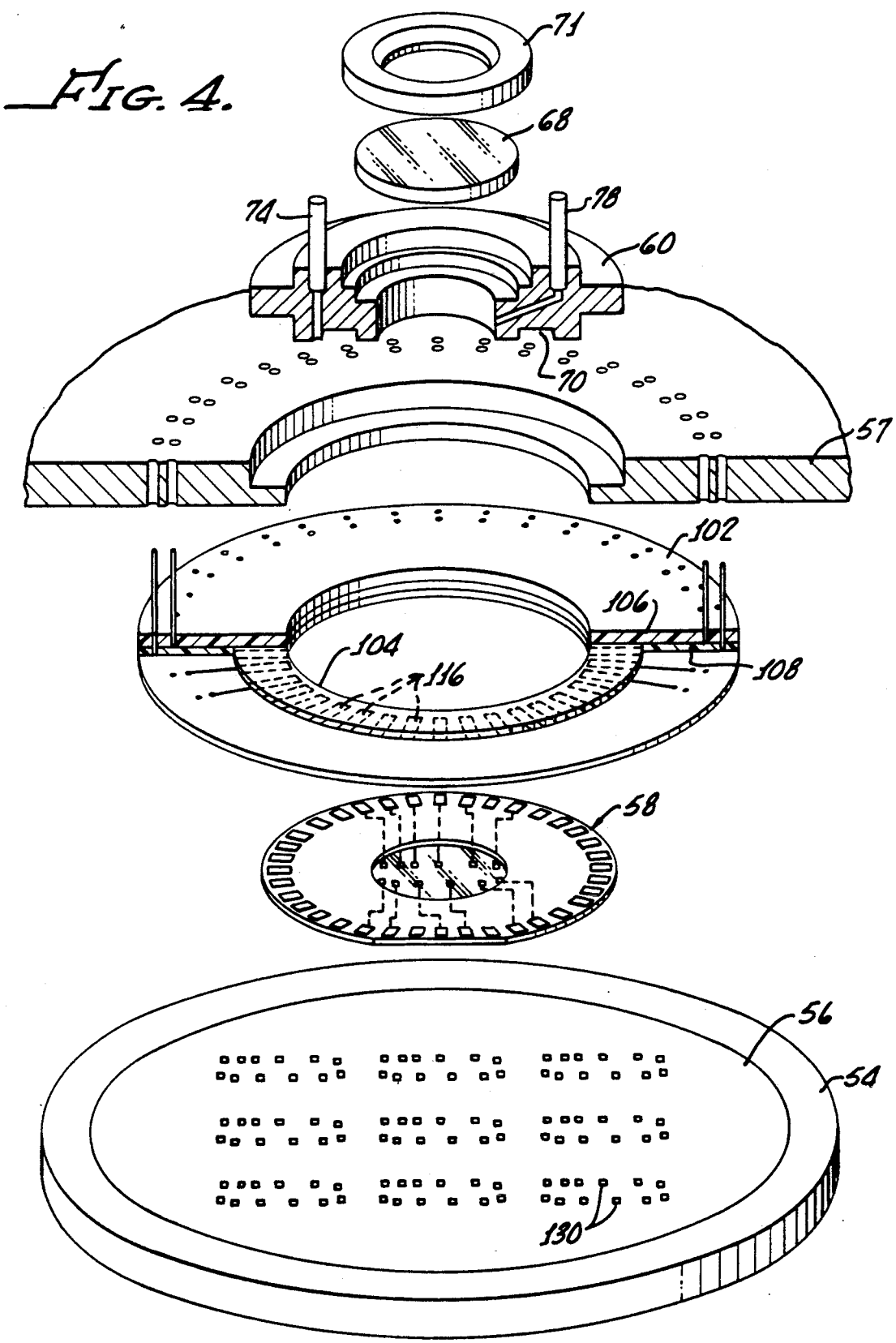

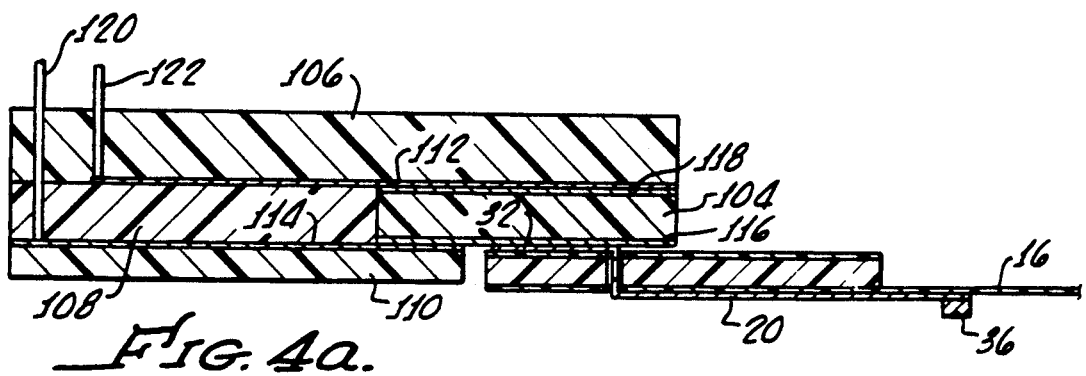
_Fig. 4a._
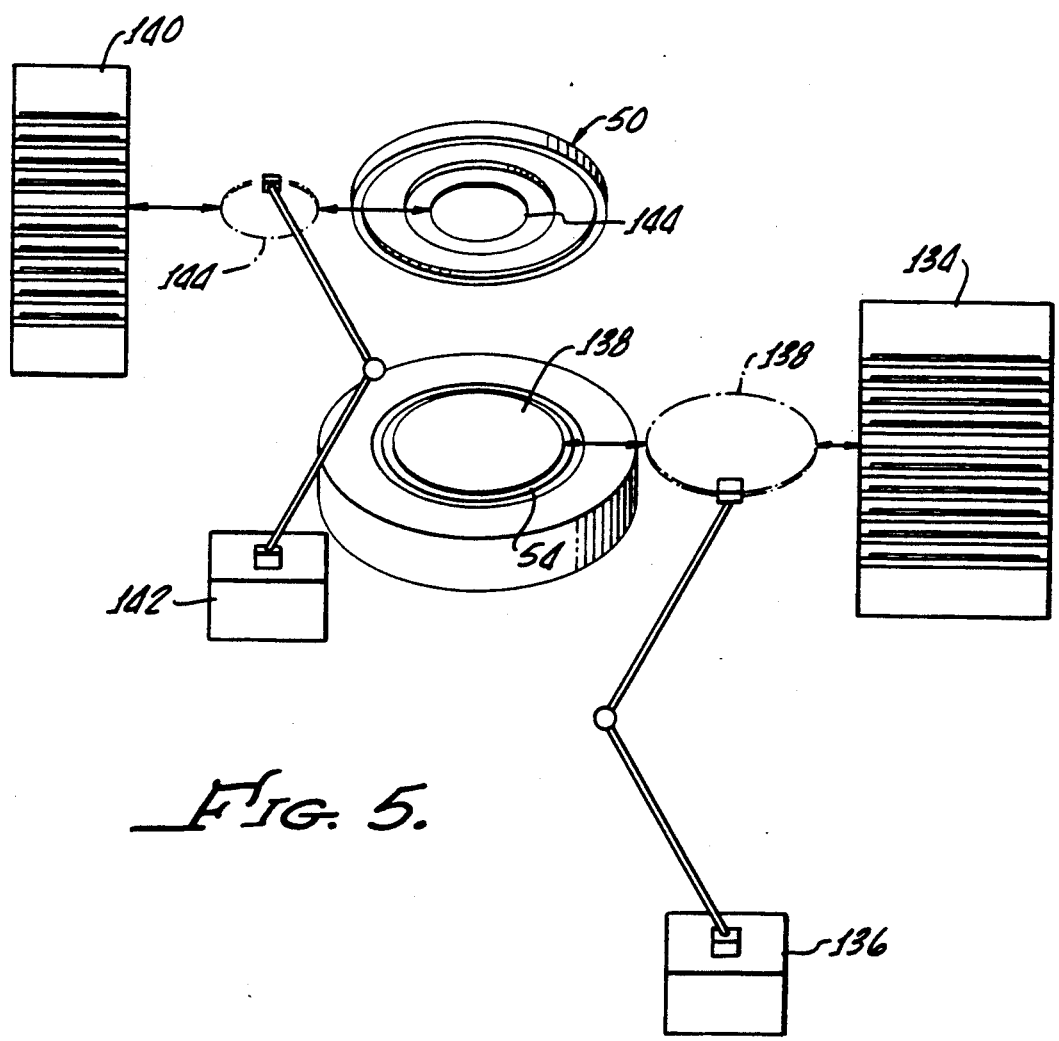
_Fig. 5._

APPARATUS FOR TESTING INTEGRATED CIRCUITS

This application is related to co-pending application Ser. No. 277,819, filed Nov. 30, 1988, invented by Albert Kamensky, James H. Cliborn and Louis E. Gates, Jr., for DIAPHRAGM TEST PROBE and assigned to the assignee of the present application.

BACKGROUND OF THE INVENTION

1. Field of the Invention

The present invention relates to testing of integrated circuits and more particularly concerns improved test fixtures and probes that readily lend themselves to automated testing and efficient probe manufacture and use.

2. Description of the Related Art

Integrated circuits or chips including conductive traces, electrical components, and active devices are fabricated in batches of large numbers of similar or identical circuits on a single wafer and then individually cut from the wafer for use. Because production techniques and processes are pushed to the limits of accuracy and repeatability, significant numbers are of circuits on a single wafer may be unacceptable or inoperable. Therefore it is desirable to test each circuit individually before it is separated from the other by severing the wafer into its many component circuits for its intended use.

Probe cards presently employed for testing of integrated circuits while still on the wafer employ a number of probe contact elements, commonly in the form of very small blades or needles that are mechanically and electrically fixed to a circuit board or the like and have leads that fan out to outer edges of the probe card for making connections between the probe card and testing circuitry. The contact blades or needles of the probe card are moved into contact with specific areas, namely the pads of the integrated circuit or chip under test, and may be electrically connected so as to apply selected input signals and to read output signals from the device under test. In this manner the chips are tested on the wafer, before being connected for intended use, by applying operating signals and monitoring and evaluating resultant outputs.

Probe cards presently employed are bulky and complex, being difficult to store and handle. Mechanical contact needles and blades require precise alignment and positioning. They also require precise planarization. That is, the contact surfaces of the probe must all lie in the same plane. An example of such a probe card employing a number of small, thin metal blades having needle like probe members fixed thereto is illustrated in U.S. Pat. No. 4,161,692 of Tarzwell for Probe Device For Integrated Circuit Wafers. In probe cards of this type the individual probe blades or needles must be mounted individually, frequently by use of micromanipulators to properly locate the closely packed small probe elements, which then may be soldered or otherwise fixed in place. Final position adjustment in both X,Y, and Z, that is, in lateral position and elevation, is then accomplished for individual ones of the probe blades and needles by bending. For planarization, the probe card may be brought down upon a flat plate so as to ensure that all of the probe contacts will touch at the same time. These procedures are time consuming, tedious and expensive. Moreover, because the final positioning of contacts of prior probe cards is accomplished by bending of the metal blades or needles, the device is subject to errors caused by creep. That is, the parts, after bending, tend to "creep" or return to an original condition or position in which they existed prior to being stressed during the bending adjustment process. The creep occurs even when the probe card is on the shelf and not being used, so that, after a period of months or sometimes weeks on the shelf, the probe contacts may need to be readjusted. More frequent adjustment and probe maintenance may be required when the probes are used.

In use of such probe cards the contact between the probe card blades or needles and the circuit chip is frequently made by a scrubbing action, which tends to deflect the slender probe elements as much as several mils on each touchdown. This displacement, which occurs repetitively upon each test, further tends to change the desired positioning of the elements.

The probe may have from fifty to several hundred contacts, each of which must be precisely and individually positioned with respect to all others so that upon contact with the circuit chip all probe contacts will contact all pads of the chip under test. All of this means that the probe cards presently used are exceedingly expensive, require much maintenance, and are subject to many errors.

Other probes employing blades and needles are illustrated U.S. Pat. No. 4,783,625 to Emory J. Harry et al, and U.S. Pat. No. 4,791,363 to John K. Logan. U.S. Pat. Nos. 4,849,689 to Gleason and 4,697,143 to Lockwood show cantilevered trapezoidal probes which may include detachable tip sections and circuit boards that mount probe conductors.

As integrated circuit speeds increase, so too do the difficulty and extent of the testing problems. Such problems are caused by cross talk between adjacent signal traces, signal loss and degradation due to capacitative loading of the circuit under test, and increased need for shielding and impedance matching of signal lines throughout the test fixture and test head. High frequency probe transmission lines must be properly terminated. Although high frequency hardware can be provided up to the test head itself, the physical connection between the test head and the integrated circuit pad, which relies upon exposed metallic blades or needles, provides poor high frequency performance and extremely fragile components. Thus the final part of the probe transmission line cannot be properly terminated.

It is often necessary to increase the density of probe contact pads and to provide test contact with chip pads that are located at the interior of the chip. This may require that leads to the probe contacts cross one another or that the blades or needles of the existing probe cards cross one another. Such a crossing of blades or needles is not physically possible with present configurations of test probes.

As size and spacing of integrated circuit chips decrease and density of chip contacts increases, it becomes ever more difficult to make mechanical blade or needle contacts as small and closely spaced as required for proper testing of modern integrated circuit chips. Moreover, the great bulk and complex configuration of prior art probe cards do not readily lend themselves to automated handling or simplified storage. Frequently the relatively costly test fixtures themselves must be changed whenever the probe card is changed for testing of a different chip configuration.

The test probe described in the above-identified co-pending patent application of Kamensky et al employs photolithographically formed probe contacts and leads to eliminate many of these problems but fails to provide for a number of improvements that are available with the methods and apparatus described herein. The disclosure of such co-pending application is incorporated by this reference as though fully set forth herein.

Accordingly, it is an object of the present invention to provide for testing of integrated circuit chips while avoiding or minimizing above-mentioned problems.

SUMMARY OF THE INVENTION

In carrying out principles of the present invention in accordance with a preferred embodiment of one feature thereof, a plurality of circuit chips of different configuration are tested by providing a plurality of test probes of which each is configured for testing an unique chip configuration. The probes are stored in a cassette. A chip to be tested is positioned adjacent a test fixture, and a pick and place machine is employed to selectively extract a chosen test probe from the cassette and move it to the fixture to which it is detachably connected, both mechanically and electrically, to allow the test probe to contact the chip to be tested.

According to another feature of the invention, a test probe is formed of a flexible membrane having a pattern of electrically conductive traces formed on the membrane, a plurality of contact pads on selected ones of the traces, and connector pads on the membrane connected to the traces to facilitate rapid detachable electric connection to a test fixture.

According to other features of the invention, the membrane probe may have a terminating resistor for terminating a high frequency transmission line or may have a buffer chip, to provide high impedance, low capacitance loading. Multiple layers of a probe membrane may be employed to attain complex geometry of probe contact pads and trace patterns.

BRIEF DESCRIPTION OF THE DRAWINGS

In the drawings:

FIG. 4 is a pictorial view (with parts broken away) of a test fixture and work table for testing integrated circuit chips of a wafer, showing a modified elastomeric connecting annulus;

FIG. 4a is an enlarged sectional detail showing aspects of the connecting annulus of FIG. 4;

FIG. 5 is a simplified schematic illustration showing use of pick and place machines for handling test wafers and membrane probes;

DESCRIPTION OF THE INVENTION

Figure 1:
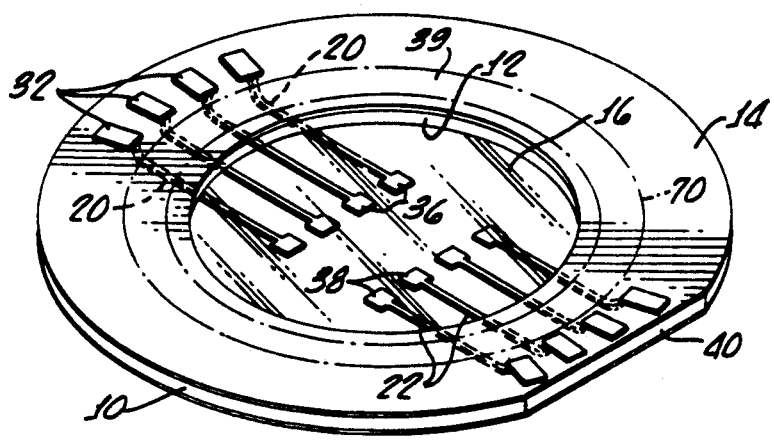
FIG. 1 is a perspective view of a membrane probe embodying principles of the present invention.
Figure 2:
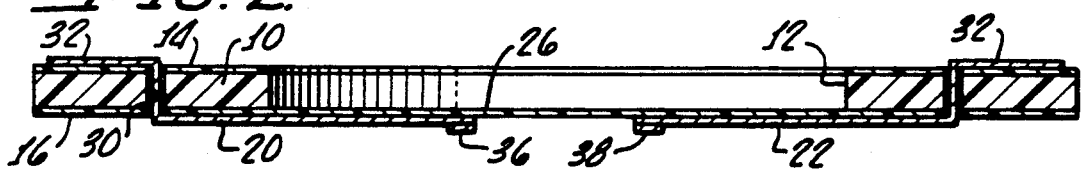
FIG. 2 is a cross section of the probe of FIG. 1.

FIGS. 1 and 2 illustrate a membrane probe embodying principles of the present invention. This probe is an improved version of the diaphragm test probe disclosed in the above-identified co-pending patent application of Kamensky, Cliborn, and Gates, Jr. The probe disclosed in the present application has a number of features in common with that of the earlier copending application, including a flexible diaphragm, conductive contact pads and an arrangement for applying pressure to one side of the flexible diaphragm to accomplish self planarizing contact of the probe pads against the pads of a die or chip under test. The membrane probe disclosed herein has a number of significant improvements over the probe of the co-pending application, among which are the specific probe configuration and arrangement that adapt the probe for use in fully automatic wafer testing processes using conventional pick and place loading and cassette storage of both membrane probes and test wafers. In the design to be described herein the probe is a low cost membrane probe that is readily attachable to and detachable from the test fixture so that the fixture itself does not have to be duplicated each time a new probe is built.

An exemplary membrane probe is illustrated in FIGS. 1 and 2 for purposes of explaining the present invention. The probe is formed of an electrically non-conductive rigid or semi-rigid and self supporting substrate 10 in the configuration of a generally flat, thin disc having a central aperture 12 and clad on both sides with thin layers of a transparent flexible dielectric such as polyimide layers 14,16. Outer layer 16 extends across central aperture 12 but inner layer 14 does not, being of an annular configuration with a central aperture coextensive with substrate aperture 12. A pattern of traces 20,22 is formed on one side (an outer or lower side) of the substrate, upon polyimide layer 16. The traces extend from trace end portions, disposed in a selected pattern at a central portion 26 of the membrane 16, within the boundaries of substrate aperture 12, to fan out in generally radial directions to a plurality of metallized vias (apertures) 30 that extend through the substrate and polyimide layers on each side. The inner side of the probe, which bears the polyimide layer 14, carries a plurality of relatively short, radially extending connector pads 32, each of which may be connected to one of the traces 20,22 by means one of the appropriately located metallized vias 30. The inner end of each trace bears an axially projecting contact pad, such as pads 36,38, such contact pads being positioned in a configuration that will match the pads of a circuit die that is to be tested. Alternatively, connector pads 32 may be formed directly on the substrate 10, omitting layer 14. In use of the probe, with the outer layer 16 facing downwardly, the contact pads 36,38 are the lowest points of the probe, so that only these pads will contact a chip to be tested.

Substrate 12 is formed preferably of a thin rigid photoceram material having a flat edge section 40 (FIG. 1) formed on one side thereof to enable handling and orientation by well known pick and place equipment, as will be described below. The entire membrane probe is dimensioned, configured and arranged to be handled by known pick and place equipment which may be substantially identical to equipment arranged to handle the wafers to be tested.

In manufacture of the described membrane probe the photoceram substrate 12, in the form of a solid, substantially rigid and self-supporting disc, is provided with a number of preformed holes to be used as the vias 30. Preferably the photoceram disc may have the diameter of a standard wafer and may be either three inches or six inches in diameter, for example, having a thickness of about 30-40 mils. A layer of the membrane 14,16 is applied to each side of the photoceram substrate by employing standard spinning techniques in which a small amount of polyimide is placed on the photoceram surface and the disc spun to centrifugally distribute the polyimide evenly and radially outwardly. Several repetitions of this spinning process will build up the membrane thickness to provide a finished polyimide membrane of about 1 mil in thickness on each side of the photoceram substrate. The polyimide is highly transparent, as described in the above-identified co-pending application, to enable visual registration of the membrane probe contact pads 36,38 with appropriate pads on the wafer die being tested. Although the polyimide film may be applied in various ways, the spinning process is preferred because it yields a film that, although axially flexible in the central area 26, is radially taut so that the film is dimensionally stable in the plane of the film but may be flexed outwardly by gas pressure, as will be described below.

After application of the polyimide film to both sides, the traces and pads are formed on one side. The pads are then formed on the other side and the aperture 12 is formed in the photoceram and also in the inner polyimide layer 14. To perform these steps, after photolithographically applying resist in a suitable pattern to the outer polyimide layer 16, a metal such as a mixture of tungsten with a small amount of titanium, W(Ti), is sputtered over the entire surface including the resist and vias, and the resist (and portions of the sputtered metal) is then lifted to leave a pattern of thin, sputtered traces forming the pattern of traces 20 on the polyimide layer 16. The traces 20, which may be formed of copper, for example, are then electrolytically plated up on the pattern of sputtered on metal traces, at the same time metallizing the interior of the vias 30. Then the entire lower surface, except for those areas at the end of traces 20 that are to be covered by contact pads 36,38, is coated with a passivation layer (not shown), which may be of a polyimide, to effectively electrically insulate the conductive trace surfaces. Now, using photolithography, masking and applying resist, the contact pads 36,38 are plated up (to a height of 1 mil, for example) on the ends of traces 20. If deemed necessary or desirable the contact pads may be flash coated with a highly stable conductive material such as a nickel-gold flash coating.

Similarly, photolithography, employing suitable application of resist, development of the resist and removal of the undeveloped resist, is then employed to first sputter a thin metal coating on inner layer 14 in the desired pattern of connecting pads 32 which then may be copper plated to provide a plurality of connecting pads (about 1 mil high) that extend in closely spaced relation circumferentially around the periphery of the inner side of the membrane probe, as can be best seen in FIG. 1. Each of these pads is positioned at a metallized via 30 so that each pad is electrically connected via such via to an associated one of the traces 20. If deemed necessary or desirable when forming the connecting pads 32, additional ground traces or ground strips (not shown in FIGS. 1 and 2) may be formed on the surface of polyimide layer 14 or on an adjacent polyimide layer (not shown in FIGS. 1 and 2).

After forming the conductive traces on both sides of the membrane probe by suitable masking and application of resist, the aperture 12 is etched through the center of substrate 10 (and through the center of layer 14), resulting in the final probe configuration illustrated in FIGS. 1 and 2. The result is a thin, relatively rigid, self-supporting disc having a flat edge 40 for orientation by automatic handling equipment and a thin, flexible, taut, transparent central area 26 to the outer side of which are affixed the projecting probe contact pads 36,38 in a selected pattern that matches the pattern of pads on the die to be tested. The other side of the probe has an annular array of connecting pads 32, all lying in a single plane and a flat annular surface 39 (FIG. 1) between the connecting pads and aperture 12. Annular surface 39 is used for vacuum attachment of the probe, as will be described below.

The illustrated membrane probe may be used with many different types of testers. It is preferably used with application of a suitable pressure, such as a gas pressure, against the inner surface of the central portion 26 of the flexible transparent membrane. However, the probe illustrated is specifically designed for use in a test fixture to which the probe may be readily mechanically and electrically connected and disconnected, either manually or by automatic machines. In the illustrated probe configuration, both electrical and mechanical connection of the probe to a test fixture are accomplished in coordination with the configuration of the inner surface of the probe. This inner surface of the probe includes the co-planar connecting pads 32 that form a substantially circular array around the periphery of the inner side of the probe, and the flat annular inwardly facing surface 39 of polyimide layer 14 that extends radially between the connecting pads 32 and the boundary of the aperture 12 that extends through the substrate. This flat annular surface is configured and arranged to enable vacuum attachment of the membrane to a vacuum chamber 70 of the fixture 50, shown in FIGS. 3 and 3a, as will be described below.

Figure 3:
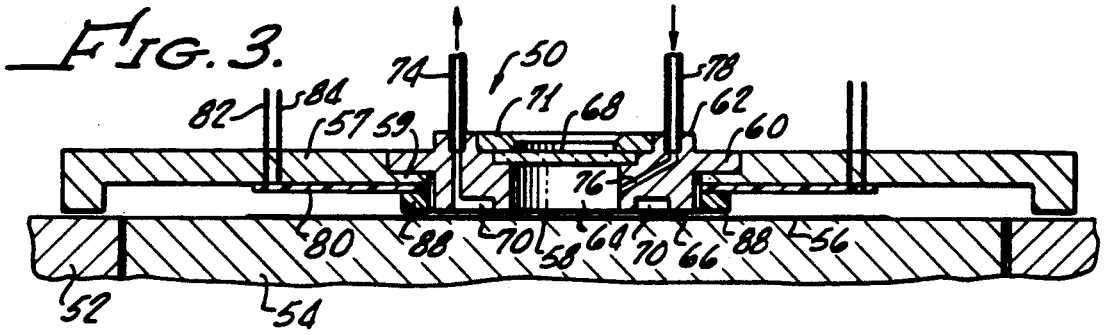
FIG. 3 is a sectional view of a test fixture and work table for testing integrated circuit chips of a wafer.
Figure 3A:
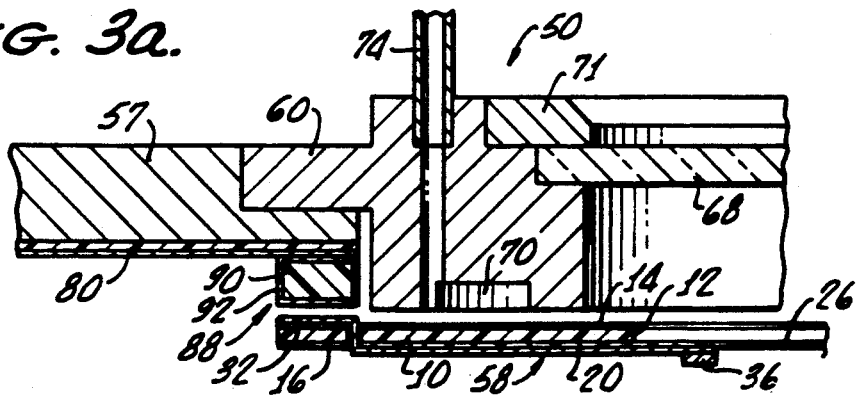
FIG. 3a is an enlarged sectional detail of a portion of the test fixture of FIG. 3.

Illustrated in FIG. 3 is a test fixture, generally indicated at 50, fixedly mounted to and above a support 52 that carries a movable work table 54 on which is mounted a test wafer 56 that is to be tested by a membrane probe 58. The latter may be of the configuration illustrated in FIGS. 1 and 2. The work table is movable in X,Y and Z, that is, in two perpendicular directions horizontally, and in one direction vertically by suitable manually controllable means (not shown).

As can be seen in FIG. 3, a rigid mounting plate 57 is fixedly carried on support 52 and has a central aperture defined by a radially inwardly directed lip 59 which supports circumferential radially outwardly extending flanges 60 of a gas chamber housing 62. Housing 62 is circular in horizontal section and includes an inner right circular cylindrical gas chamber 64 that is closed and sealed at its upper end by a clear, transparent glass window 68 held in place by a retainer ring 71. Chamber housing 62 has a planar annular lower surface defining a peripheral seating area 66 that is congruent with the annular portion 39 of substrate 10 of probe 58, between the connector pads 32 and the boundary of aperture 12 of the wafer probe.

An annular recess 70, formed in the bottom surface 66 of the housing, is connected by a conduit 74 to a source of vacuum (not shown) so as to firmly affix the probe 58 to the bottom surface of housing 62 in a gas tight sealing relation when vacuum is applied through the conduit. Thus the membrane probe is securely mechanically attached in a readily attachable and detachable fashion to the test fixture.

An angulated gas conduit 76, formed at and extending through one side of the housing 62, is adapted to be connected by means of a fitting 78 to a source of pressurized gas, such as air, which will apply a pressure within sealed chamber 64 in the order of two to four pounds per square inch, thereby causing flexible membrane layer 16 to flex outwardly.

For readily detachable and attachable electrical connection of the wafer probe to the test fixture, a printed circuit board 80 is fixedly secured to the fixture mounting plate 57 as by mechanical fasteners, clamps or adhesive (not shown). Printed circuit board 80 has coaxial electrical cables 82,84 connecting circuit elements on the board 80 to test circuitry (not shown). Leads on the printed circuit board 80 are connected to an elastomeric electrical connector 88 in the form of a wrap-around metal-on-elastomer or wrap-around MOE. The wrap-around MOE comprises an annulus 90 of a suitable elastomer, such as a silicon sponge, that has a plurality of circumferentially spaced, closely positioned, narrow metal contacting strips 92 (FIG. 3a) wrapped entirely around the elastomer. The circumferential spacing of the contact strips 92 on the MOE is the same as that of the connector pads 32 on the membrane probe. The two sets of connecting strips and pads, the connector strips 92 of the MOE and the connector pads 32 of the probe, are positioned to mate with one another when the membrane probe is mechanically secured by the vacuum of annular recess 70 to the test fixture housing 60.

An alternate configuration of the elastomeric probe connector or wrap-around MOE 88 is shown in FIG. 4. In FIG. 4 the probe tester mounting plate 57, test fixture housing 60, glass window 68, and retainer 71 are the same as those illustrated in FIG. 3. FIG. 4 shows these same parts in a pictorial view with parts broken away. However, in the arrangement of FIG. 4, an elastomeric probe connector in the form of a single sided metal on elastomer or single sided MOE 104 is used instead of the wrap-around MOE of FIGS. 3 and 3a. The single sided MOE is embedded in a multi-level printed circuit board 102 (see the enlarged detail of FIG. 4a). The multi-level printed circuit board is formed of an upper layer of copper plate 106, an intermediate layer of Teflon 108, and a lowermost printed circuit board of polyimide or glass epoxy 110. A pattern of ground traces or ground strips 112 is sandwiched between the copper and Teflon and a pattern of signal traces 114 is sandwiched between the Teflon and polyimide or glass epoxy. The intermediate Teflon layer 108 is radially set back to provide a recess, defined between the outer layers 106 and 110, that receives the single sided MOE 104. MOE 104 includes elongated electrically conductive pads 116 on its lower surface which contact the connector pads 32 of the membrane probe and also the signal leads 114 of the multi-level printed circuit board. The MOE also includes elongated contact pads 118 on its upper surface which contact the ground traces or strips 112 of the printed circuit board, thereby electrically connecting the membrane probe to the test fixture. Suitable electrical connections in the form of vias (not shown) extending through the MOE connect the elongated pads 118 on its upper surface to associated connecting pads 32 on the membrane probe. As in the arrangement of FIG. 3, the signal leads 114 and ground leads 112 of the circuit board are coupled to testing circuitry by means of coaxial connecting cables 120,122.

Also shown in the pictorial view of FIG. 4 are the test probe 58 and the work table 54. The table temporarily but fixedly supports the wafer 56 which is to be tested. The small rectangles indicated at 130 on the wafer 56 represent die pads of the chips that are to be tested. The die pads define a pattern that is precisely matched by the contact pads of the wafer probe 58. It will be readily understood that the contact pads may be made in a pattern and number sufficient to test a single group of die pads so that testing of all groups of die pads on a wafer will be achieved by testing one group at a time. Alternatively, the number and pattern of probe contact pads may be the same as the number and pattern of die pads of several or all circuits on the wafer so that several or all chips can be contacted in one position of the membrane probe.

In either the arrangement of FIG. 3 or FIG. 4 the metal-on-elastomer fixture connector affords a simple, rapid detachable electrical connection between the test fixture and connector pads on the membrane probe. The latter is formed with its circular peripheral array of connector pads 32, which precisely match the circular peripheral array of connector pads 92 or 116 of the wrap-around or single sided MOE. The resilient elasticity of the MOE ensures good electrical contact of all connector pads when the wafer is pressed upwardly against the fixture by means of the applied vacuum. Because of the resilient support and mounting of the MOE connector pads 92 and 116, they may readily deflect individually relative to one another when contacted by the associated connector pads 32 of the membrane probe to assure good firm, but detachable, electrical connection of the membrane probe to the test fixture and to ensure planarity so that all connector pads will be in good electrical contact.

The described arrangement of fixture and membrane probe readily lend themselves to automatic test operation in a system such as schematically depicted in FIG. 5. In such an automatic system a cassette storage device 134 stores a plurality of test wafers (bearing dies to be tested) which may be selectively extracted by a conventional type of pick and place machine such as that schematically indicated at 136. A test wafer, such as wafer 138 illustrated in FIG. 5, is extracted from storage cassette 134 and placed on the work table 54 of the test fixture.

Similarly, a second cassette storage device 140 stores a number of different membrane probes, all of which have the same mechanical size and configuration but which differ from one another by different patterns of traces and contact pads. A second pick and place machine 142, is arranged to extract a selected membrane probe from storage device 140 and position it on the test fixture 50 for connection in the manner illustrated in FIGS. 3 and 4. FIG. 5 illustrates a membrane probe 144 being extracted from storage 140 by pick and place machine 142 to be positioned at and mechanically and electrically connected to the test fixture 50. After the test probe has been positioned in contact with the elastomeric probe connector, vacuum is applied via conductor 74 to mechanically fix the probe to the fixture, and the test wafer is moved upwardly to or toward a very light contact with the wafer contact pads. Now the operator visually observes the contact pads, which are readily visible through the probe aperture 12 and the transparent membrane 16 upon which the contact pads are mounted. While the operator observes relative registration of the probe contact pads with the die pads, the table 54 and wafer 38 thereon are moved to precisely align the probe contact pads with the die pads of the wafer. The table then may be slightly raised an additional amount to a point where the pads are barely or almost contacting the die pads, and gas pressure then is applied to the test fixture chamber 64. The applied gas pressure on the thin flexible polyimide film forces the probe contact pads into contact with the wafer die pads, providing a high contact pressure while the flexibility of the membrane that carries the contact pads provides a self planarization of the contact pads to ensure good firm electrical contact between each probe pad and its associated die pad.

A typical wafer may contain dozens or hundreds of groups of die pads, and the probe membrane may contain one or more groups of contact pads so that one or more chips on the wafer under test may be tested at a given time. After completing a test on one chip or group of chips the gas pressure is released from the chamber 64 and the table is moved to enable visual registration of the probe contact pads with a second group of die pads, whereupon the test is accomplished again after pressurization of the wafer probe membrane chamber. It will be readily understood that the test procedure itself, after the appropriate contact is made between the test fixture and the wafer to be tested, can be carried out in an exceedingly short time, whereas the time required to properly position the test probe and wafer under test is considerably longer. The arrangements described herein greatly decrease the positioning and registration time and significantly facilitate visual registration so as to greatly increase the rate of testing.

Figure 6:
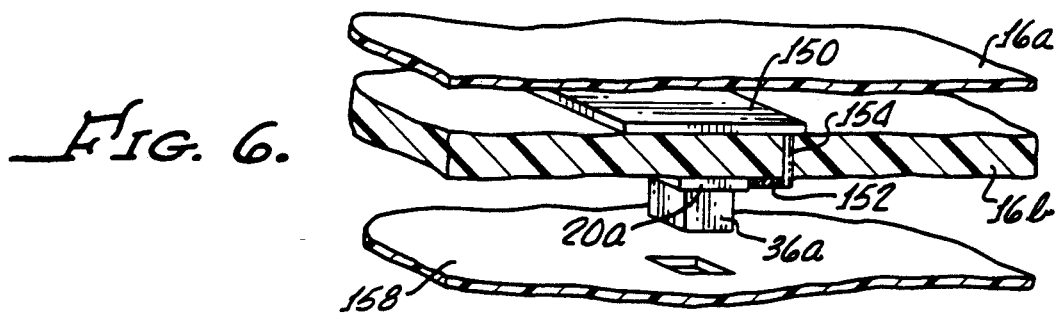
FIG. 6 is an enlarged pictorial illustration, partly exploded, of a detail of a test probe having a multi-level membrane, showing a probe contact pad and a terminating resistor.

Illustrated in FIG. 6 is a fragmentary partly exploded detail of an end portion of one of the transmission lines 20a, 150 of a multi-level membrane probe showing application of a terminating resistor. A passivation layer is also shown in this figure. In the arrangement illustrated in FIG. 6 a trace 20a carrying a probe contact pad 36a is positioned on one side of the membrane probe comprising a photoceramic substrate (not shown in FIG. 6) between two polyimide layers. In this case it is preferred to use a multi-level membrane so that a second flexible, transparent polyimide membrane 16a is formed on the outer side of the photoceram substrate, between the substrate and a first flexible transparent polyimide membrane 16b. A ground strip or ground lead 150 is photolithographically formed on the outer surface of the second membrane 16a, as previously described herein with respect to first membrane 16 and traces 20. Although certain of the layers of FIG. 6 are shown exploded for clarity of illustration, it will be understood that all of the illustrated layers are in full contact with each other. The combination of ground strip 150 and trace 20a forms an AC transmission line having a readily controlled predetermined impedance. Impedance of the line is controlled by selectively controlling the cross sectional width of the trace and ground strip, and the thickness of the dielectric membrane 16b that separates the trace and ground strip. For proper transmission of high frequency signals between the probe and the circuit under test it is necessary to terminate the transition line with an impedance that is the same as the impedance of the transmission line itself. Preferably the terminating resistor must be physically located as close as possible to the circuit under test. In prior arrangements, particularly those employing blades and needles, transmission line termination by appropriate resistance is not possible at a point close to the chip under test. In the arrangement described herein, however, and as particularly illustrated in FIG. 6, a thin film terminating resistor 152 of chromium or the like is formed to contact the trace 20a. The terminating resistor is formed so as to be electrically connected to the trace 20 and to ground strip 150 by means of a metallized via 154 extending through the probe membrane 16b. The terminating resistor is located immediately adjacent pad 36a. Both of the membranes 16a and 16b, on which traces and ground strips are fixed, are on the same outer side of the photoceram substrate and all leads are passivated or covered with a very thin layer of non-conductive polyimide, such as the polyimide passivation layer 158, excepting only the connector pads and contact pads. With this arrangement the transmission line is effectively terminated at the contact pad 36a which will be precisely at the die to be tested.

The polyimide base layer 16a and passivation layer 158 may be typically about 0.2 mils thick, whereas the thickness of layer 16b is chosen in conjunction with cross sections of the trace 20a and ground strip 150 to obtain the selected characteristic impedance of transmission line 20a, 150. This thickness may be about 1 mil for a 50 ohm transmission line.

Figure 7:
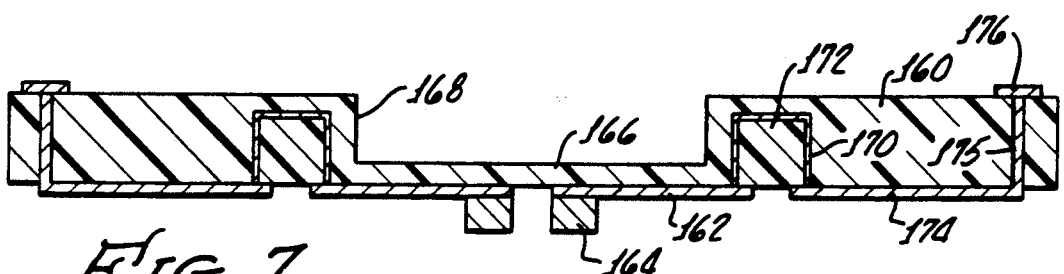
FIG. 7 is a sectional view of a modified membrane probe having an active buffer chip.

The described arrangement lends itself to the construction of membrane probes of very low capacitance. Active buffer chips can be mounted on the photoceram substrate for even lower capacitance loading. Thus, as illustrated in FIG. 7, a photoceram substrate 160 has traces 162 formed thereon as previously described and including projecting contact pads 164 located at the unsupported center area 166 of the flexible transparent polyimide membrane which spans the substrate aperture 168. Radially outwardly of the photoceram wafer aperture 168 one or more wells 170 are formed in the wafer body. In these wells are mounted active buffer chips, such as chip 172, having an input connected to trace 162 and having a line driver output connected to an output trace portion 174 on the wafer. The output trace 174 is connected to a membrane probe connector pad 176 by means of a metallized via 178. Power leads (not shown) are also connected to the chip 172. With such an arrangement capacitance loading of under 2 pF is possible.

Figure 8:
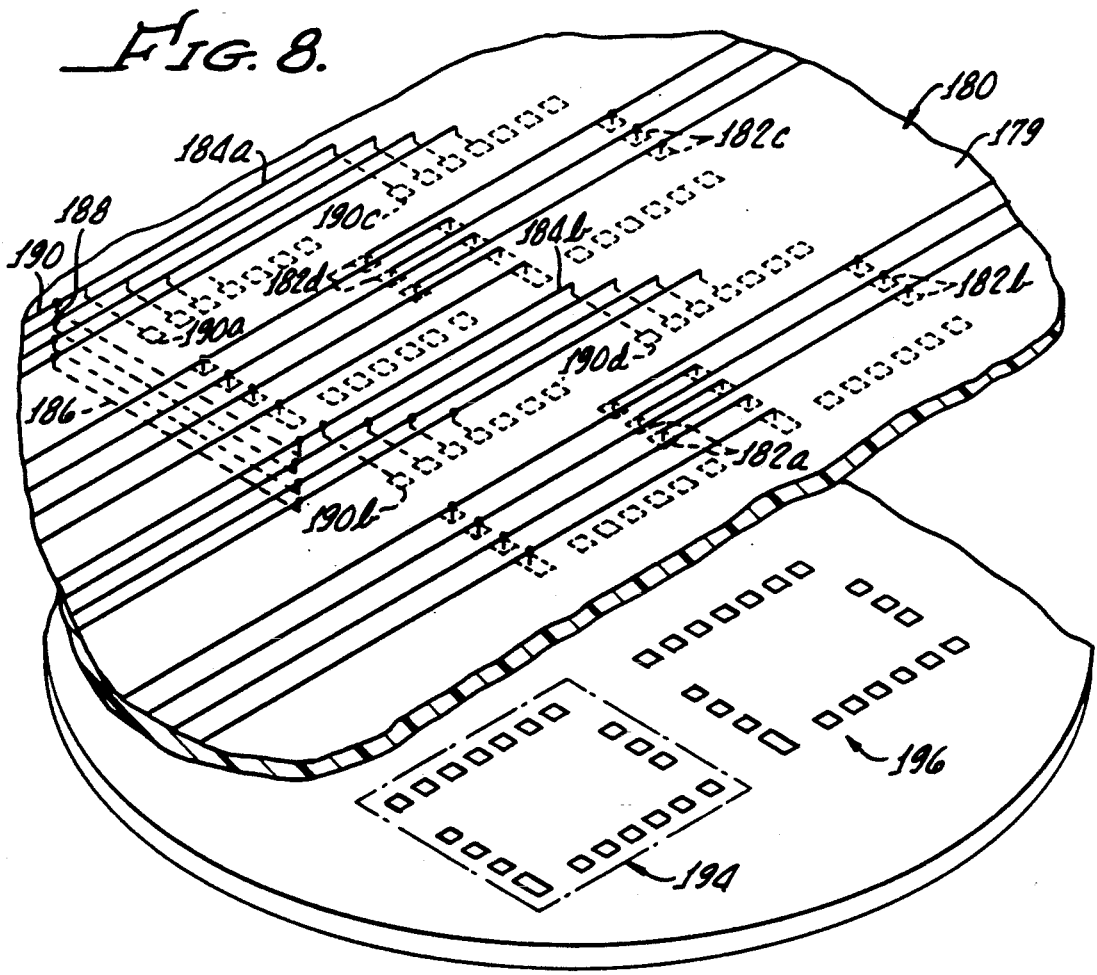
FIG. 8 illustrates a multiple level probe membrane.

Although the very small dimension and high density with which the traces 20 and pads 36 may be located greatly enhances application and operation of the described membrane probes, even greater two dimensional freedom of probe pad location is achieved by employing multiple level membranes. With such multiple level membranes, traces can be allowed to physically cross one another on different layers and single data busses may be arranged to connect to corresponding pads in plural groups of pads, thereby enabling testing of multiple dies with one touchdown. For example, as illustrated in FIG. 8, a fragment of a membrane probe including a layer of photoceram clad on both sides with a polyimide membrane as previously described, has its outer membrane 180 formed on its outer (lower) side with a plurality of patterns of contact pads generally indicated at 182a, 182b, 182c and 182d. On the inner (or upper) side 179 of membrane 180 are formed groups of traces, such as traces 184a and 184b. The traces on the upper surface 179 may be formed directly on the membrane 180 or, as disclosed in connection with FIG. 6, may be formed on a second polyimide layer (not shown in FIG. 8) that is in direct face to face contact with layer 180. The traces on the upper surface 179 are electrically connected to traces 186 and contact pads on the lower surface by means of vias, such as vias 188, extending through the membrane 180. In this arrangement, for example, a single trace, such as trace 190, of a data bus may be connected to several pads, such as pads 190a, 190b, 190c and 190d, by means of connecting traces that cross each other (and cross other traces) on opposite sides of the non-conductive membrane 180. In the multiple level arrangement of FIG. 8 traces on both sides of the membrane are connected to peripheral probe connector pads (not shown in FIG. 8) such as pads 32 of FIGS. 1 and 2 on the inner side of the photoceram. This illustration is given only by way of example to show the simplicity with which a single line may be connected to corresponding pads on multiple chips of the wafer.

The trace pattern and contact pad pattern of each probe are determined by the arrangement of die pads to be tested. Die pads of two of such chips are illustrated at 194 and 196 in FIG. 8. For higher density of interconnecting traces the membrane probe may be made with two or more layers of mutually insulated dielectric film. With the arrangements of membrane probes illustrated herein probe pads may be located for connection to die pads at the interior of a chip for use in integrated circuit diagnostics. The described membrane probe specifically enables very high probe contact density. For example, a three inch diameter membrane probe may be formed with up to 360 contact pads, whereas a six inch diameter membrane probe may be formed with more than 360 contact pads. Using the metal-on-elastomer flexible connector to connect the membrane probe to the test fixture, and utilizing the vacuum clamping of the membrane probe greatly facilitate the use of such high density probes.

It will be readily appreciated that the test probe and fixture and the method of testing described herein have a great many advantages. These advantages include the availability of densities of probe contact pads in the order of 360 contact pads or more on a single six inch probe, the ability to precisely control impedance of transmission lines for superior high frequency performance, the availability of thin film terminating resistors located immediately adjacent die pads for superior high frequency performance, and the soft contact provided by the probe contact pads which causes less damage to die pads than needle or blade contacts of prior probe cards. Further advantages include the visual clarity of the membrane which allows precise alignment of the probe contact pads to semiconductor pads and use and manufacture of probe pads of less than 1 mil in dimension. In addition, virtually unrestricted two dimensional freedom of probe contact locations is available using photolithographic definition techniques and multiple level membranes. This allows probe pads located in the interior of a die to be contacted by probe pads for use in diagnostics. Multiple groups of die pads can be tested in a single touchdown. Burn-in of a wafer circuit can be performed using the described membrane probe.

The temperature coefficient of resistance of the membrane can be matched to the temperature coefficient of resistance of a wafer under test so that testing over an extended range of temperatures is possible. Without such matching of temperature coefficients of resistance, a different expansion of the test probe membrane and the wafer would cause serious misalignment or require use of different probes at different temperatures.

Manufacture of the probes described herein is much faster, more efficient, and less expensive since once the appropriate dies and masks for the photolithographic techniques employed have been manufactured it is relatively simple to manufacture a large number of membrane probes. This is to be distinguished from those probes employing needles and blades which must be individually adjusted on each probe. The self planarizing of the described flexible membrane probe provides a soft contact between the contact pads of the probe and the die pads, causing considerably decreased wear on the probe contacts which require only routine cleaning and need not be frequently adjusted and readjusted.

With the described membrane probe alignment accuracy of 1 to 2 microns is possible with a high accuracy probe station that enables precision X,Y motion of the wafer under test. Having such high accuracy alignment, it is feasible to make and employ probe pads of less than 1 mil.

The membrane probe test fixture, which is a relatively high cost item, does not have to be duplicated for each different probe card since many different types of probe cards may be employed and readily attached to or detached from the fixture, which is adapted to fully automatic testing as described. The quick disconnect connector element employing metal-on-elastomer technology firmly contacts the connector pads on the inner side of the membrane probe and facilitates rapid mechanical and electrical interengagement and disengagement of the membrane probe with the fixture.

What is claimed is:

1. Apparatus for testing integrated circuit chips comprising:
    a fixture mounting member having test circuitry connections,
    an elastomeric member carried by said mounting member and having a plurality of connector elements thereon,
    said elements being electrically connected to said test circuitry connections, and
    a probe comprising:
        a flexible membrane,
        a plurality of contact pads on said membrane,
        a plurality of electrical conductors on said membrane electrically connected to said contact pads, said conductors and contact pads being positioned on one side of said membrane,
        a substrate having a first side supporting said membrane and having a second side,
        means for connecting said membrane to said fixture mounting member,
        a plurality of membrane connector pads formed on said second side of said substrate and connected to said conductors,
    said probe being positioned in said fixture mounting member with said membrane connector pads in contact with said connector elements of said elastomeric member.

2. The apparatus of claim 1 including a plurality of vias extending through said substrate and electrically interconnecting said conductors and said membrane pads.

3. The apparatus of claim 1 wherein said membrane connector pads are positioned around the periphery of said second side of said substrate and wherein said second side has a smooth, flat annular surface configured and arranged to be forcibly attracted by a vacuum applied by a test fixture.

4. The apparatus of claim 1 wherein said means for connecting said membrane comprises means for applying a vacuum to said membrane to pull said membrane toward said elastomeric member.

5. The apparatus of claim 4 including a gas chamber fixed to said mounting member and sealed to said membrane, and means for introducing pressurized gas into said chamber.

6. The apparatus of claim 1 wherein said connector elements of said elastomeric member are resiliently supported by said elastomeric member for deflection individually relative to one another.

7. The apparatus of claim 1 wherein said fixture mounting member is in annular member having an annular inner peripheral portion, said elastomeric member comprising a resilient annular member fixed to said peripheral inner portion of said fixture mounting member, said substrate comprising an annular body having an open inner area, and said flexible membrane fixed to and extending across said open inner area.

8. Apparatus for testing integrated circuit chips comprising:
a fixture mounting member having test circuitry connections,
an elastomeric member connected to said mounting member and having a plurality of connector elements thereon,
said elements being electrically connected to said test circuitry connections,
a probe including:
a probe body having first and second sides,
probe contact elements on said first probe side,
probe connector pads on said second probe side, and electrically connected to said probe contact elements, and
cooperating means on said fixture mounting member and probe for detachably mechanically interconnecting said probe to said fixture mounting member in a probe operational position, said probe connector pads in said operational position of said probe being in firm electrical contact with said connector elements of said elastomeric member.

9. The apparatus of claim 8 wherein said cooperating means comprises means for urging said probe toward and against said elastomeric member.

10. The apparatus of claim 8 wherein said cooperating means for detachably mechanically interconnecting said probe comprises means for applying a vacuum to said probe to pull said probe toward said elastomeric member.

11. The apparatus of claim 8 including a gas chamber fixed to said mounting member and sealed to said probe, and means for introducing pressurized gas into said chamber, said probe including a flexible membrane on which are mounted said probe contact elements.

12. The apparatus of claim 8 wherein said elastomeric member comprises an elastomeric annulus having a plurality of circumferentially spaced electrically conductive conductor elements fixed thereto, said probe connector pads extending around the circumference of said second probe side in mutually spaced relation and electrically contacting said conductor elements.

13. The apparatus of claim 8 wherein said fixture mounting member comprises a multi-level printed circuit board having a plurality of electrical conductors and said elastomeric member is secured thereto with said connector elements of said elastomeric member extending between said probe connector pads and said electrical conductors of said printed circuit board.

14. The apparatus of claim 8 wherein said fixture mounting member comprises a multi-level printed circuit board comprising a substantially rigid inner board layer, a dielectric outer substrate layer, and an intermediate dielectric layer interposed between said dielectric outer layer and said inner layer, said intermediate dielectric layer being recessed radially outwardly of said inner and outer layers to define an annular recess, said elastomeric member comprising an elastomeric annulus positioned in said annular recess having a plurality of connecting conductors on said outer layer between said intermediate layer and said outer layer, said elastomeric member connector elements being positioned to interconnect connecting conductors of said outer layer and connector pads of said probe.

15. Apparatus for testing integrated circuit chips comprising:
a fixture mounting plate having test circuitry connections,
a gas chamber housing mounted to said fixture mounting plate,
an annular circuit board carried by said fixture mounting plate and having an internal aperture receiving a portion of said gas chamber housing, said circuit board having a plurality of electrical conductors,
an annular elastomeric member carried by said circuit board and having elastomeric member connector elements connected to said circuit board electrical conductors,
a probe including:
a flexible probe body having first and second sides,
probe contact elements on said first probe side, and
probe connector pads on said second probe side electrically connected to said probe contact elements, said probe connector pads being in contact with and pressing against said elastomeric member connector elements,
vacuum means extending into said gas chamber housing having a vacuum aperture adjacent said probe body for attaching said probe body to said mounting plate and circuit board with said probe connector pads in contact with and pressed against said elastomeric member connector elements,
said gas chamber housing having an opening in contact with said second probe side, and
means for introducing gas under pressure into said gas chamber housing to press said probe body away from said gas chamber housing.

* * * * *